(12) United States Patent
Chen et al.

(10) Patent No.: US 9,645,436 B2
(45) Date of Patent: May 9, 2017

(54) COLOR FILTER STRUCTURES FOR ELECTRONIC DEVICES WITH COLOR DISPLAYS

(71) Applicant: Apple Inc., Cupertino, CA (US)

(72) Inventors: Yu-Cheng Chen, San Jose, CA (US); Young Cheol Yang, Sunnyvale, CA (US); Hiroshi Osawa, Sunnyvale, CA (US); Shih Chang Chang, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 102 days.

(21) Appl. No.: 14/497,168

(22) Filed: Sep. 25, 2014

(65) Prior Publication Data
US 2015/0362795 A1    Dec. 17, 2015

Related U.S. Application Data

(60) Provisional application No. 62/013,467, filed on Jun. 17, 2014.

(51) Int. Cl.
*G02F 1/1335* (2006.01)
*G02B 5/20* (2006.01)
*H01L 27/32* (2006.01)

(52) U.S. Cl.
CPC ....... *G02F 1/133514* (2013.01); *G02B 5/201* (2013.01); *G02F 1/133512* (2013.01);
(Continued)

(58) Field of Classification Search
CPC ... G02F 1/133514; G02F 2001/136222; G02F 1/136209; G02F 1/133512; G02F 2201/52;
(Continued)

(56) References Cited

U.S. PATENT DOCUMENTS 7,573,548 B2   8/2009   Yang et al.
7,787,702 B2   8/2010   Brown Elliott et al.
(Continued)

FOREIGN PATENT DOCUMENTS

JP   2007133059 A   5/2007

OTHER PUBLICATIONS

Yang et al., "31.1: Development of Six Primary-Color LCD" SID 05 Digest 1213, Jan. 1, 2005, 4 pages, link.aip.org <http://www.academia.edu/1381707/31.1_Development_of_Six_Primary_Color_LCD>.

*Primary Examiner* — Paul Lee
*Assistant Examiner* — Jia Pan
(74) *Attorney, Agent, or Firm* — Treyz Law Group, P.C.; G. Victor Treyz; Zachary D. Hadd

(57) ABSTRACT

A display may have a color filter layer and a thin-film transistor layer. A liquid crystal layer may be located between the color filter layer and the thin-film transistor layer. The color filter layer may have an array of color filter elements on a transparent substrate. The array of color filter elements may include more than three colors. Colored photoimageable polymer layers may be combined to form some of the color filter elements. The color filter may have cyan, magenta, and yellow color filter elements each formed from a respective single layer of cyan, magenta, and yellow polymer and may have blue elements formed by overlapping cyan and magenta polymer, green elements formed by overlapping cyan and yellow polymer, and red elements formed by overlapping magenta and yellow polymer. Filters with white elements may also be provided.

18 Claims, 15 Drawing Sheets

(52) U.S. Cl.
CPC ........ *H01L 27/322* (2013.01); *G02F 2201/52* (2013.01); *H01L 27/3244* (2013.01)

(58) Field of Classification Search
CPC ......... G09G 3/2003; G09G 2300/0452; G09G 3/3607; G09G 3/3611; G09G 5/02; G02B 5/201; H01L 27/322; H01L 27/3213
See application file for complete search history.

(56) References Cited

U.S. PATENT DOCUMENTS

| | | |
|---|---|---|
| 8,466,856 B2 | 6/2013 | Hamer et al. |
| 8,837,063 B2 | 9/2014 | Hung et al. |
| 2002/0011971 A1* | 1/2002 | Hamamoto ....... G02F 1/133617 345/32 |
| 2002/0102480 A1* | 8/2002 | Washizu ................ G02B 5/201 430/7 |
| 2006/0098033 A1* | 5/2006 | Langendijk ............ G02B 5/201 345/694 |
| 2009/0121992 A1* | 5/2009 | Asao ................. G02F 1/133514 345/88 |
| 2009/0290102 A1* | 11/2009 | Amimori .......... G02F 1/133516 349/93 |
| 2010/0328282 A1* | 12/2010 | Su ....................... H01L 51/5237 345/206 |
| 2011/0128309 A1* | 6/2011 | Miyazaki ............. G09G 3/3607 345/690 |
| 2012/0075737 A1* | 3/2012 | Ohkawara ............... G02B 5/201 359/891 |
| 2012/0212515 A1* | 8/2012 | Hamer ................. G09G 3/2003 345/690 |

* cited by examiner

COLOR FILTER STRUCTURES FOR ELECTRONIC DEVICES WITH COLOR DISPLAYS

This application claims the benefit of provisional patent application No. 62/013,467 filed Jun. 17, 2014, which is hereby incorporated by reference herein in its entirety.

BACKGROUND

This relates generally to electronic devices, and more particularly, to electronic devices with displays.

Electronic devices often include displays. For example, cellular telephones and portable computers may have displays for presenting information to a user.

Liquid crystal displays contain a layer of liquid crystal material. Pixels in a liquid crystal display contain thin-film transistors and electrodes for applying electric fields to the liquid crystal material. The strength of the electric field in a pixel controls the polarization state of the liquid crystal material and thereby adjusts the brightness of the pixel.

Substrate layers such as color filter layers and thin-film transistor layers are used in liquid crystal displays. A thin-film transistor layer contains an array of the thin-film transistors that are used in controlling the electric fields in the liquid crystal layer. A color filter layer contains an array of color filter elements. The color filter layer provides the display with the ability to display color images. In an assembled display, the layer of liquid crystal material is sandwiched between the thin-film transistor layer and the color filter layer.

Other displays such as organic light-emitting diode displays may also have color filter layers. For example, an organic light-emitting diode display that has an array of white light diodes may use a color filter layer to impart colors to the light from the white light diodes.

Color filter layer arrays typically contain red, green, and blue color filter elements. The use of only three colors in a color filter layer restricts the color gamut that may be produced by the display. To enhance color gamut and enhance the overall transmittance of the color filter layer, additional colors may be incorporated into the color filter layer. For example, the color filter layer may be formed from color filter elements of six different colors.

Fabricating color filter layers with large numbers of color filter element colors can be challenging. Color filter elements are generally formed by depositing blanket layers of colored photoimageable polymer that are patterned photolithographically to form desired color filter element patterns. If care is not taken, an excessive number of processing steps may be needed to form the color filter elements in a color filter layer with more than three different colors.

It would therefore be desirable to be able to provide improved color filter layer arrangements for electronic devices with color displays.

SUMMARY

A display may have a color filter layer and a thin-film transistor layer. A liquid crystal layer may be located between the color filter layer and the thin-film transistor layer. The color filter layer may have an array of color filter elements on a transparent substrate. The array of color filter elements may include more than three colors formed using combinations of three colored polymers.

The color filter may, as an example, have six color filter elements such as red, green, blue, cyan, magenta, and yellow elements or red, green, blue, cyan, yellow, and white elements. Some of the color filter elements such as the cyan, yellow, and magenta elements may be formed from single layers of colored polymer. Other color filter elements such as the red, green, and blue color filter elements may be formed by overlapping two of the colored polymer layers. For example, blue color filter elements may be formed by overlapping cyan and magenta polymer layers, green color filter elements may be formed by overlapping cyan and yellow polymer layers, and red color filter elements may be formed by overlapping magenta and yellow polymer layers. Filters with white elements may be formed by omitting the magenta elements or other elements and forming clear elements that include only clear polymer and no non-clear polymer.

A black matrix for the color filter may have an array of openings in which the color filter elements are formed. The black matrix may be formed from a patterned opaque masking layer such as a layer of patterned black ink or other black masking material. If desired, the black matrix may be formed by overlapping portions of the cyan, magenta, and yellow polymer layers.

DETAILED DESCRIPTION

Electronic devices may include displays. The displays may be used to display images to a user. Illustrative electronic devices that may be provided with displays are shown in FIGS. 1, 2, 3, and 4.

Figure 1:
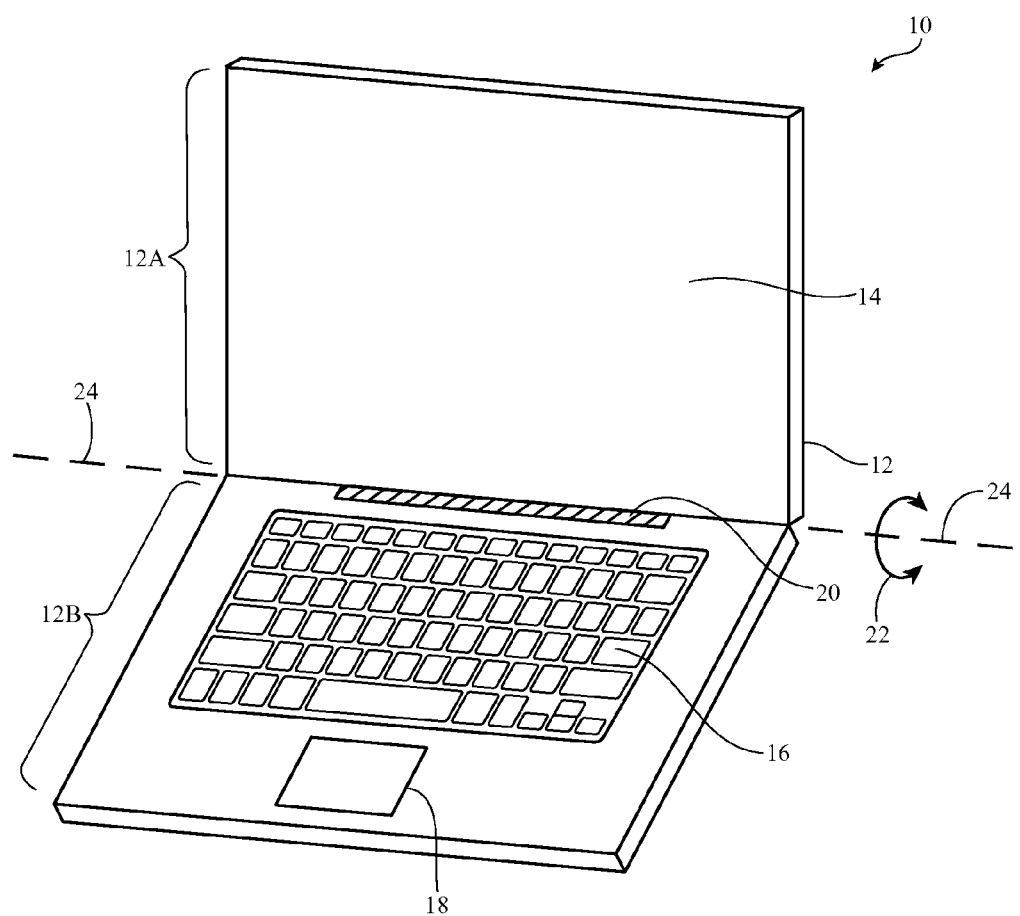
FIG. 1 is a perspective view of an illustrative electronic device such as a laptop computer with a display in accordance with an embodiment.

Illustrative electronic device 10 of FIG. 1 has the shape of a laptop computer having upper housing 12A and lower housing 12B with components such as keyboard 16 and touchpad 18. Device 10 may have hinge structures 20 that allow upper housing 12A to rotate in directions 22 about rotational axis 24 relative to lower housing 12B. Display 14 may be mounted in upper housing 12A. Upper housing 12A, which may sometimes be referred to as a display housing or lid, may be placed in a closed position by rotating upper housing 12A towards lower housing 12B about rotational axis 24.

Figure 2:
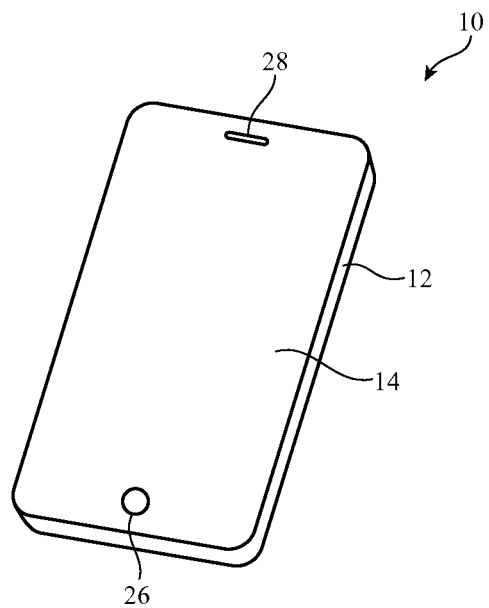
FIG. 2 is a perspective view of an illustrative electronic device such as a handheld electronic device with a display in accordance with an embodiment.

FIG. 2 shows how electronic device 10 may be a handheld device such as a cellular telephone, music player, gaming device, navigation unit, or other compact device. In this type of configuration for device 10, housing 12 may have opposing front and rear surfaces. Display 14 may be mounted on a front face of housing 12. Display 14 may, if desired, have openings for components such as button 26. Openings may also be formed in display 14 to accommodate a speaker port (see, e.g., speaker port 28 of FIG. 2).

Figure 3:
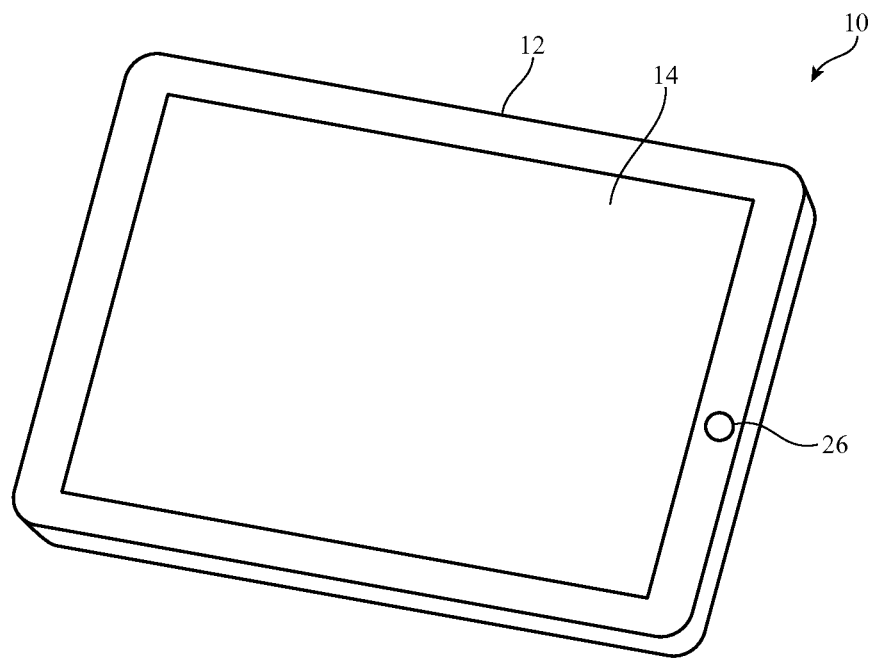
FIG. 3 is a perspective view of an illustrative electronic device such as a tablet computer with a display in accordance with an embodiment.

FIG. 3 shows how electronic device 10 may be a tablet computer. In electronic device 10 of FIG. 3, housing 12 may have opposing planar front and rear surfaces. Display 14 may be mounted on the front surface of housing 12. As shown in FIG. 3, display 14 may have an opening to accommodate button 26 (as an example).

Figure 4:
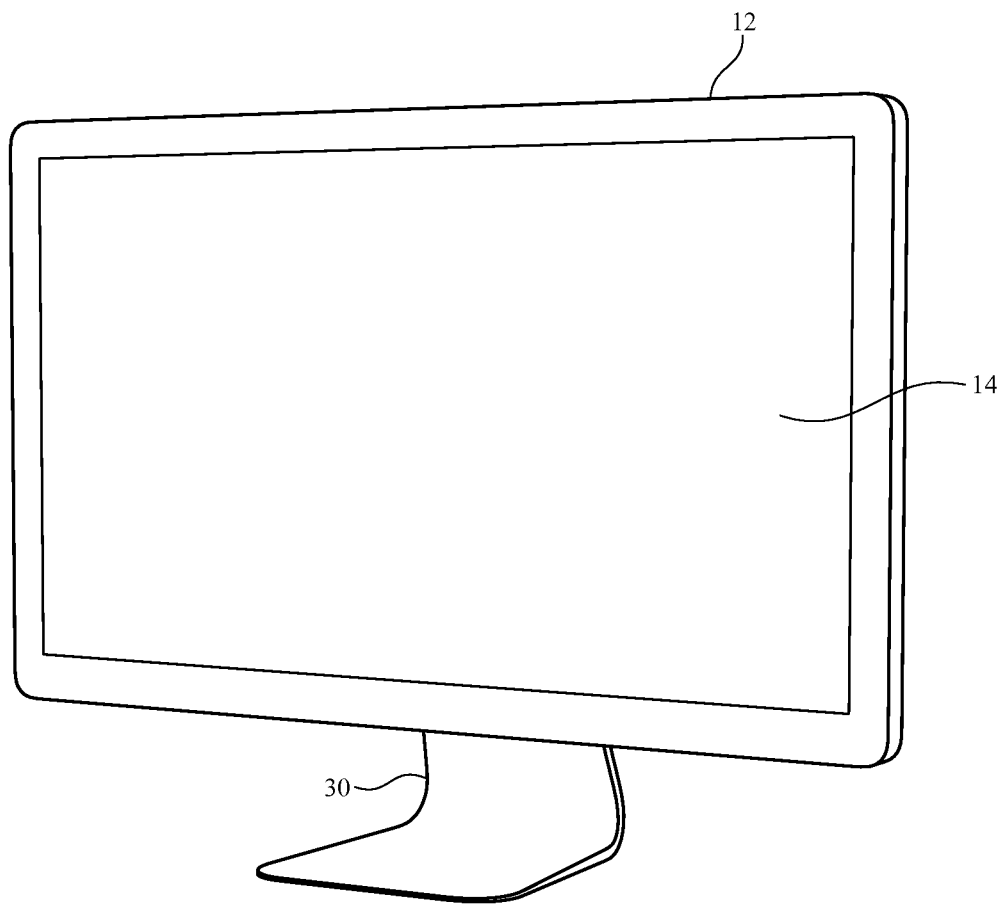
FIG. 4 is a perspective view of an illustrative electronic device such as a computer display with display structures in accordance with an embodiment.

FIG. 4 shows how electronic device 10 may be a computer display, a computer that has been integrated into a computer display, or a display for other electronic equipment. With this type of arrangement, housing 12 for device 10 may be mounted on a support structure such as stand 30 or stand 30 may be omitted (e.g., stand 30 can be omitted when mounting device 10 on a wall). Display 14 may be mounted on a front face of housing 12.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 includes display pixels formed from liquid crystal display (LCD) components, organic light-emitting diode components, or other suitable image pixel structures.

A display cover layer may cover the surface of display 14 or a display layer such as a color filter layer, thin-film transistor layer, or other portion of a display may be used as the outermost (or nearly outermost) layer in display 14. The outermost display layer may be formed from a transparent glass sheet, a clear plastic layer, or other transparent member.

Figure 5:
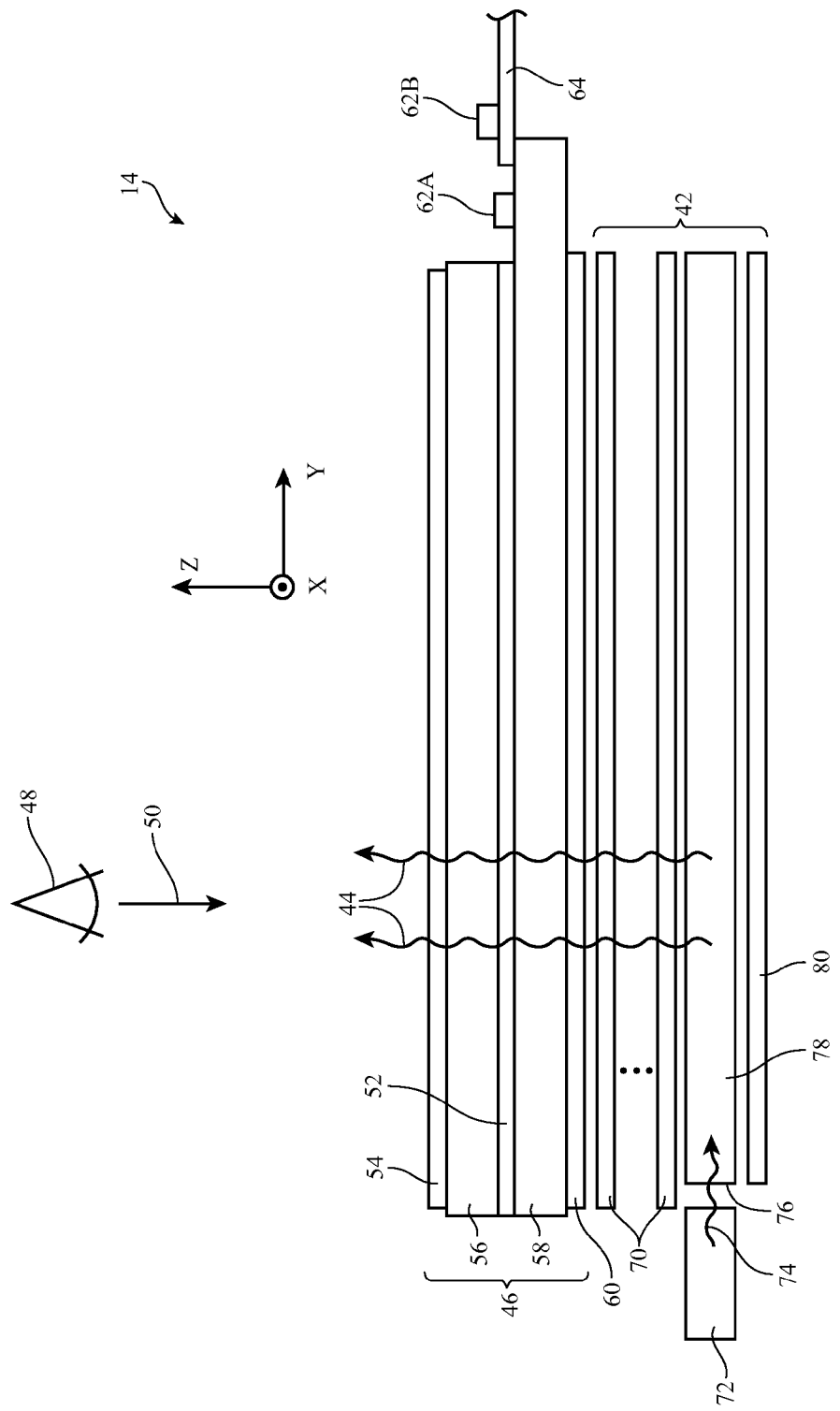
FIG. 5 is a cross-sectional side view of an illustrative display in accordance with an embodiment.

A cross-sectional side view of an illustrative configuration for display 14 of device 10 (e.g., for display 14 of the devices of FIG. 1, FIG. 2, FIG. 3, FIG. 4 or other suitable electronic devices) is shown in FIG. 5. As shown in FIG. 5, display 14 may include backlight structures such as backlight unit 42 for producing backlight 44. During operation, backlight 44 travels outwards (vertically upwards in dimension Z in the orientation of FIG. 5) and passes through display pixel structures in display layers 46. This illuminates any images that are being produced by the display pixels for viewing by a user. For example, backlight 44 may illuminate images on display layers 46 that are being viewed by viewer 48 in direction 50.

Display layers 46 may be mounted in chassis structures such as a plastic chassis structure and/or a metal chassis structure to form a display module for mounting in housing 12 or display layers 46 may be mounted directly in housing 12 (e.g., by stacking display layers 46 into a recessed portion in housing 12). Display layers 46 may form a liquid crystal display or may be used in forming displays of other types.

In a configuration in which display layers 46 are used in forming a liquid crystal display, display layers 46 may include a liquid crystal layer such a liquid crystal layer 52. Liquid crystal layer 52 may be sandwiched between display layers such as display layers 58 and 56. Layers 56 and 58 may be interposed between lower polarizer layer 60 and upper polarizer layer 54.

Layers 58 and 56 may be formed from transparent substrate layers such as clear layers of glass or plastic. Layers 56 and 58 may be layers such as a thin-film transistor layer and/or a color filter layer. Conductive traces, color filter elements, transistors, and other circuits and structures may be formed on the substrates of layers 58 and 56 (e.g., to form a thin-film transistor layer and/or a color filter layer). Touch sensor electrodes may also be incorporated into layers such as layers 58 and 56 and/or touch sensor electrodes may be formed on other substrates.

With one illustrative configuration, layer 58 may be a thin-film transistor layer that includes an array of thin-film transistors and associated electrodes (display pixel electrodes) for applying electric fields to liquid crystal layer 52 and thereby displaying images on display 14. Layer 56 may be a color filter layer that includes an array of color filter elements for providing display 14 with the ability to display color images. Configurations of this type in which the color filter layer is located above the thin-film transistor layer may sometimes be referred to as TFT-on-bottom configurations. If desired, lower layer 58 may be a color filter layer and upper layer 56 may be a thin-film transistor layer (i.e., a TFT-on-top configuration may be used for display 14). Another illustrative configuration involves forming color filter elements and thin-film transistor circuits with associated pixel electrodes on a common substrate. This common substrate may be the upper substrate or may be the lower substrate and may be used in conjunction with an opposing glass or plastic layer (e.g., a layer with or without any color filter elements, thin-film transistors, etc.) to contain liquid crystal layer 52.

During operation of display 14 in device 10, control circuitry (e.g., one or more integrated circuits on a printed circuit) may be used to generate information to be displayed on display 14 (e.g., display data). The information to be displayed may be conveyed to a display driver integrated circuit such as circuit 62A or 62B using a signal path such as a signal path formed from conductive metal traces in a rigid or flexible printed circuit such as printed circuit 64 (as an example).

Backlight structures 42 may include a light guide plate such as light guide plate 78. Light guide plate 78 may be formed from a transparent material such as clear glass or plastic. During operation of backlight structures 42, a light source such as light source 72 may generate light 74. Light source 72 may be, for example, an array of light-emitting diodes. If desired, light sources such as light source 72 may be located along multiple edges of light guide plate 78.

Light 74 from light source 72 may be coupled into edge surface 76 of light guide plate 78 and may be distributed in dimensions X and Y throughout light guide plate 78 due to the principal of total internal reflection. Light guide plate 78 may include light-scattering features such as pits or bumps. The light-scattering features may be located on an upper surface and/or on an opposing lower surface of light guide plate 78.

Light 74 that scatters upwards in direction Z from light guide plate 78 may serve as backlight 44 for display 14. Light 74 that scatters downwards may be reflected back in the upwards direction by reflector 80. Reflector 80 may be formed from a reflective material such as a layer of white plastic or other reflective materials.

To enhance backlight performance for backlight structures 42, backlight structures 42 may include optical films 70. Optical films 70 may include diffuser layers for helping to homogenize backlight 44 and thereby reduce hotspots, compensation films for enhancing off-axis viewing, and brightness enhancement films (also sometimes referred to as turning films or prism films) for collimating backlight 44. Optical films 70 may overlap the other structures in backlight unit 42 such as light guide plate 78 and reflector 80. For example, if light guide plate 78 has a rectangular footprint in the X-Y plane of FIG. 5, optical films 70 and reflector 80 may have a matching rectangular footprint. If desired, optical films such as these may be incorporated into other portions of display 14. For example, compensation films may be incorporated into polarizer layers, etc.

Display 14 may have a rectangular array of pixels. Vertical lines (sometimes referred to as data lines) may be used to supply data signals to columns of pixels. Horizontal control lines (sometimes referred to as gate lines) may be used in controlling rows of pixel circuits in the thin-film transistor layer. In response to the gate line signals and data signals, the pixel circuits of display 14 use electrodes to apply electric fields to corresponding pixel-sized portions of liquid crystal layer 52 and thereby control the brightness of the pixels in display 14 (i.e., the thin-film transistors control the emitted light for the pixels by controlling how much light 44 passes through each pixel).

Display 14 may be an organic light-emitting diode display. In an organic light-emitting diode display configuration, thin-film transistor layer 58 may have an array of organic light-emitting diodes that emit light to form images. The circuitry of the thin-film transistor is controlled to control the emitted light from the diodes, which form the pixels of the display. Each diode may have an anode and a cathode (e.g., a shared cathode) and a layer of electroluminescent organic material that is interposed between the anode and cathode. When current is applied to the diodes by thin-film transistor control circuitry in the thin-film transistor layer, the diodes emit light (e.g., white light in an array of white light organic light-emitting diodes). Because the diodes in the array emit light, liquid crystal layer 52 and backlight unit 42 may be omitted. The color filter elements of color filter layer 56 may be aligned with the diodes of the thin-film transistor layer.

The color filter in display 14 is used to impart color to the light that is passing through each pixel (i.e., backlight 44 from backlight unit 42 in a liquid crystal display or the light from the array of organic light-emitting diodes in an organic light-emitting diode display). The color filter (color filter layer) has a patterned array of color filter elements of different colors. Photoimageable polymers that include colored dyes may be photolithographically patterned to form the color filter elements. For example, a blanket layer of a photoimageable polymer of a particular color may be deposited on the surface of a glass substrate or other transparent substrate. Photolithography may then be used to pattern the deposited polymer layer. Multiple layers of photoimageable polymers of different colors may be deposited and patterned in this way.

To separate color filter material into discrete color filter elements corresponding to respective pixels, a black matrix may be formed as part of the color filter. The black matrix has an array of openings in which color filter elements of different colors are formed. For example, the black matrix may have a grid shape with rows and columns of rectangular openings. Configurations in which chevron-shaped openings or openings of other shapes are formed in the black matrix may also be used. Black matrix arrangements with rectangular openings are sometimes described herein as an example.

In some arrangements, a black masking layer (e.g., a layer of photoimageable polymer that contains a black additive such as carbon black or other opaque masking material) may be patterned to form the black matrix. In other configurations, overlapping portions of color filter element material of different colors may be used in forming the black matrix.

To enhance display performance (e.g., to increase color filter layer transmittance and to increase color gamut), it may be desirable to form the color filter in display 14 using more than three color filter element colors. Examples of colors that may be used in forming the color filter include red, green, blue, cyan, magenta, yellow, and clear. Different colors may be used, if desired. Six of these colors, four of these colors, or other suitable sets of these colors may be used in forming the color filter.

Figure 6:
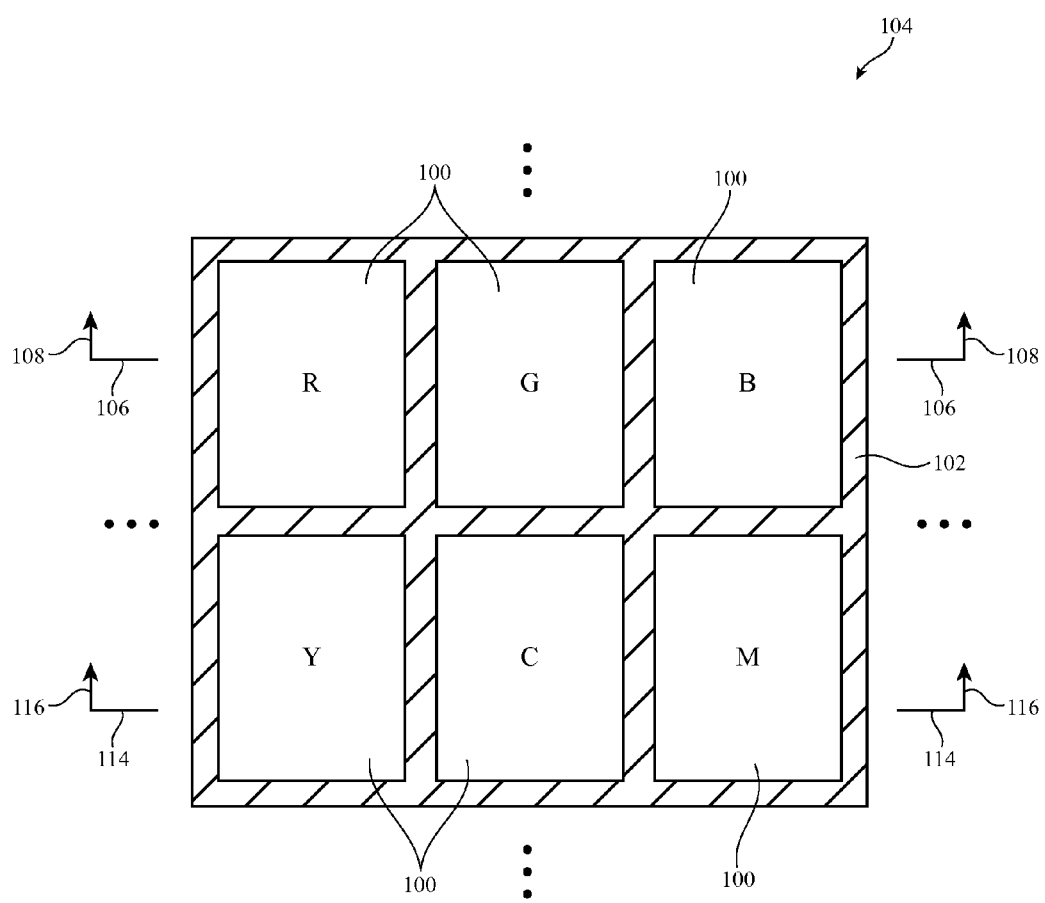
FIG. 6 is a top view of portion of a color filter layer showing how the color filter layer may have color filter elements of six different colors where each set of six colors is grouped in two rows of three elements each in accordance with an embodiment.

Color filter elements for the color filter may be organized in sets (tiles) with any suitable color filter element pattern (e.g., a repeating 1×6 array of six different colors may be used, a repeating 2×3 block of six different colors may be used, etc.). FIG. 6 is a top view of a portion of a color filter 104 in which a repeating 2×3 block of color filter elements is used in forming a color filter array. Color filter elements 100 of FIG. 6 may include a red color filter element (R), a green color filter element (G), a blue color filter element (B), a yellow color filter element (Y), a cyan color filter element (C), and a magenta color filter element (M). Black matrix 102 may be formed from black photoimageable polymer (i.e., black masking material) or may be formed form overlapping color filter element layers (e.g., overlapping colors that block light and therefore serve as black matrix structures).

The 2×3 block of color filter elements 100 that is shown in FIG. 6 and the sets of color filter elements 100 in the other FIGS. may cover the entire surface of display 14 in a tiled fashion. In the example of FIG. 6, the upper row of the six-element set of color filter elements 100 contains red R, green G, and blue B color filter elements, whereas the lower row contains yellow Y, cyan C, and magenta M color filter elements. Other patterns may be used for the color filter elements that make up color filter 104 in display 14. The configuration of FIG. 6 is merely illustrative.

To minimize the number of process steps that are used in forming color filter 104, it may be desirable to form at least some of the colors for color filter elements 100 by overlapping multiple layers of color filter layer material. In this way, the total number of color filter element materials can be minimized. As an example, six different colors of color filter elements may be formed using just three different colored photoimageable polymer layers—a magenta layer, a cyan layer, and a yellow layer. The magenta layer may be used to produce magenta color filter elements. The cyan layer may be used to form cyan color filter elements. The yellow layer may be used to form yellow color filter elements. The cyan layer and magenta layer may be overlapped to form blue color filter elements. The cyan layer and the yellow layer may be used to form green color filter elements. The magenta and the yellow layer may be used to form red color filter elements.

Figure 7:
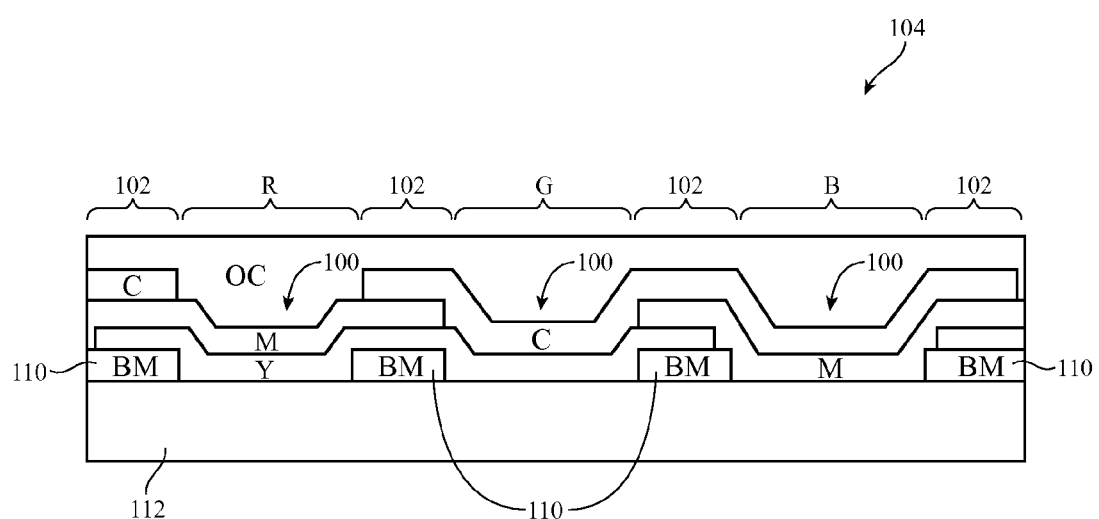
FIG. 7 is a cross-sectional side view of the color filter layer of FIG. 6 taken through the upper row of color filter elements in a configuration in which the color filter layer has a black matrix formed from black masking material in accordance with an embodiment.

A cross-sectional side view of the upper row of color filter elements of FIG. 6 taken along line 106 and viewed in direction 108 in a configuration in which black matrix 102 is formed form black masking material 110 is shown in FIG. 7. As shown in FIG. 7, black masking material 110 can be deposited and patterned on transparent color filter substrate 112 to form black matrix 102. Yellow Y color filter element material (e.g., a layer of yellow photoimageable polymer), magenta M color filter element material (e.g., a layer of magenta photoimageable polymer), and cyan C color filter element material (e.g. a layer of cyan photoimageable polymer) may then be deposited and patterned. Clear polymer overcoat layer OC may be deposited on top of the color filter element layers (e.g., to form a planarization layer that is adjacent to liquid crystal layer 52 when color filter layer 104 is assembled into a completed display 14). In portions of color filter 104 in which yellow polymer overlaps magenta polymer, red color filter elements R are formed. In portions of color filter 104 in which yellow and cyan polymer layers overlap, green color filter elements G are formed. Blue color filter elements B are formed by overlapping cyan and magenta layers.

Figure 8:
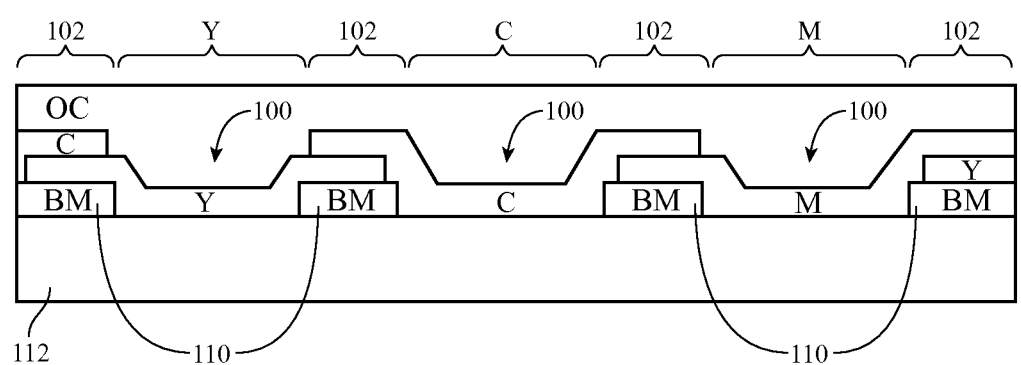
FIG. 8 is a cross-sectional side view of the color filter layer of FIG. 6 taken through the lower row of color filter elements in a configuration in which the color filter layer has a black matrix formed from black masking material in accordance with an embodiment.

A cross-sectional side view of the lower row of color filter elements of FIG. 6 taken along line 114 and viewed in direction 116 is shown in FIG. 8. As shown in FIG. 8, black matrix 102 is formed from black masking material 110. Black masking material 110 is patterned to form color filter element openings for respective color filter elements (e.g., rectangular openings, chevron-shaped openings, etc.). A color filter element 100 of a different color is formed in each black matrix opening. Yellow Y color filter element material (e.g., a single layer of the yellow photoimageable polymer), cyan C color filter element material (e.g. a single layer of cyan photoimageable polymer), and magenta M color filter element material (e.g., a single layer of magenta photoimageable polymer) may be deposited and patterned to form respective yellow color filter element Y, cyan color filter element C, and magenta color filter element M in the openings. Each color filter element 100 in of FIG. 8 is formed using a single layer of color filter element material. Because the same three colored polymer layers (yellow, cyan, and magenta) are used in forming the Y, C, and M color filter elements of FIG. 8 and the R, G, and B color filter elements of FIG. 7, a complete six-color set of color filter elements (Y, C, M, R, G, and B) can be produced using only three layers of colored polymer. The use of a set of colored polymers having fewer colors than the total number of different colors in the color filter elements simplifies processing and reduces the cost and complexity of color filter 104.

If desired, black matrix 102 may be formed by overlapping different polymer layers of different colors. Each polymer layer subtracts a different portion of the white spectrum and when multiple layers are overlapped, no white light can pass. The overlapping areas of the colored polymer layers therefore appear black and serve to form a grid-shaped black matrix 102. Because the overlapping polymer layers (color filter element material layers) can be used to form black matrix 102, it is not necessary to incorporate black masking material 110 into color filter 104. Black masking material 110 can therefore be reduced or omitted with this approach.

Figure 9:
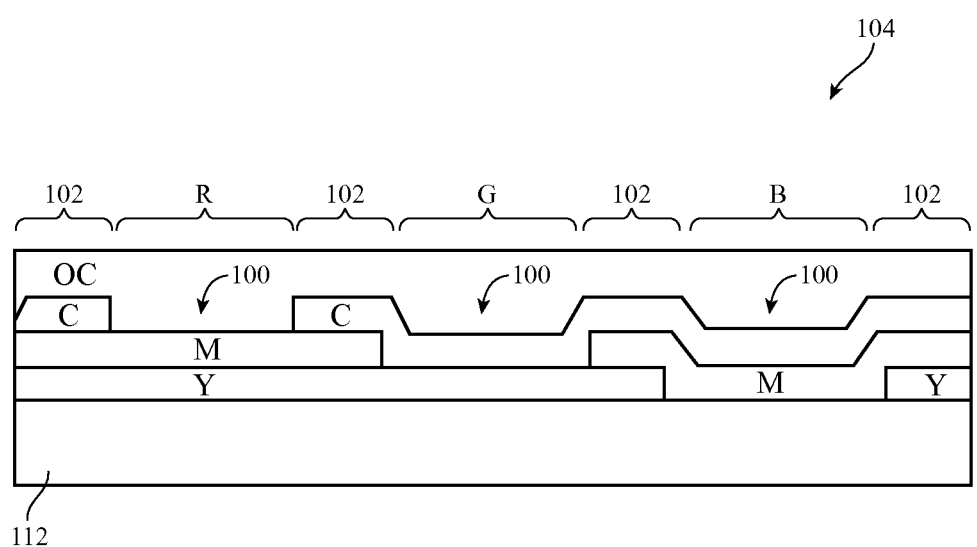
FIG. 9 is a cross-sectional side view of the color filter layer of FIG. 6 taken through the upper row of color filter elements in a configuration in which the color filter layer has a black matrix formed from overlapping colored layers of color filter element material in accordance with an embodiment.
Figure 10:
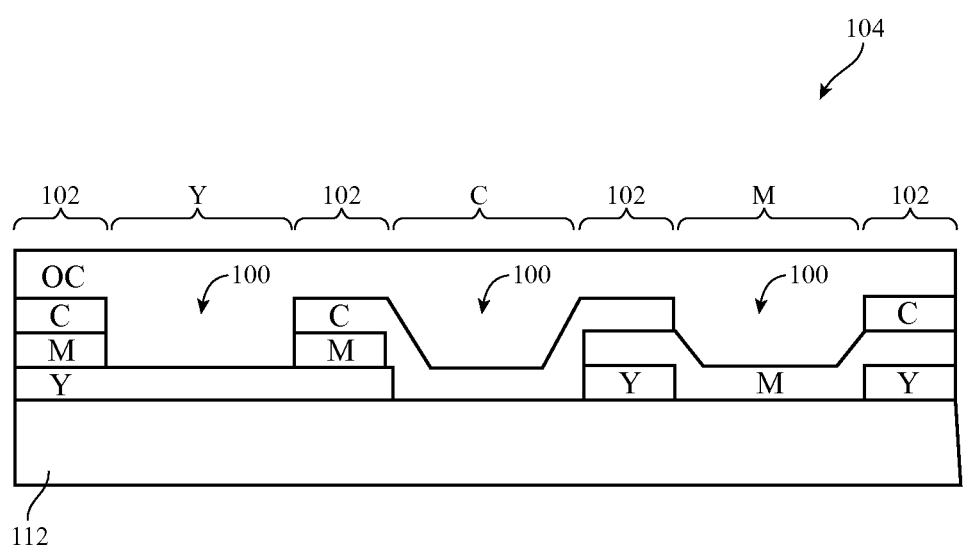
FIG. 10 is a cross-sectional side view of the color filter layer of FIG. 6 taken through the lower row of color filter elements in a configuration in which the color filter layer has a black matrix formed from overlapping colored layers of color filter element material in accordance with an embodiment.

A cross-sectional side view of the upper row of color filter elements 100 of FIG. 6 taken along line 106 and viewed in direction 108 in a configuration in which black masking material 110 has been omitted and in which black matrix 102 has been formed by overlapping portions of the colored photoimageable polymer layers that are used in forming color filter elements 100 is shown in FIG. 9. As shown in FIG. 9, yellow polymer layer Y and magenta polymer layer M may overlap to form red color filter element R. Cyan polymer layer C and yellow polymer layer Y overlap to form green color filter element G. Blue color filter element B is formed in the portion of color filter 104 in which magenta color filter element material M overlaps cyan color filter element material C. Black matrix 102 is formed in the portions of color filter 104 in which cyan polymer C overlaps magenta polymer layer M and yellow polymer Y. Little or no white light can pass through all three of these colors (C, M, and Y) in tandem, so the overlap of the C, M, and Y layers effectively forms portions of black matrix 102 without involving the extra process steps involved in depositing and patterning a separate black masking layer. A cross-sectional side view of the lower row of color filter elements 100 of FIG. 6 taken along line 114 and viewed in direction 116 in a configuration in which black matrix 102 is formed form overlapping color filter element materials of different (non-black) colors is shown in FIG. 10. As with the structures of FIG. 9, black matrix 102 of FIG. 10 is formed from overlapped regions of cyan, magenta, and yellow polymer. Color filter elements 100 are formed from layers of yellow polymer Y (for yellow color filter element Y), cyan polymer C (for cyan color filter element C), and magenta polymer M (for magenta color filter element M).

Figure 11:
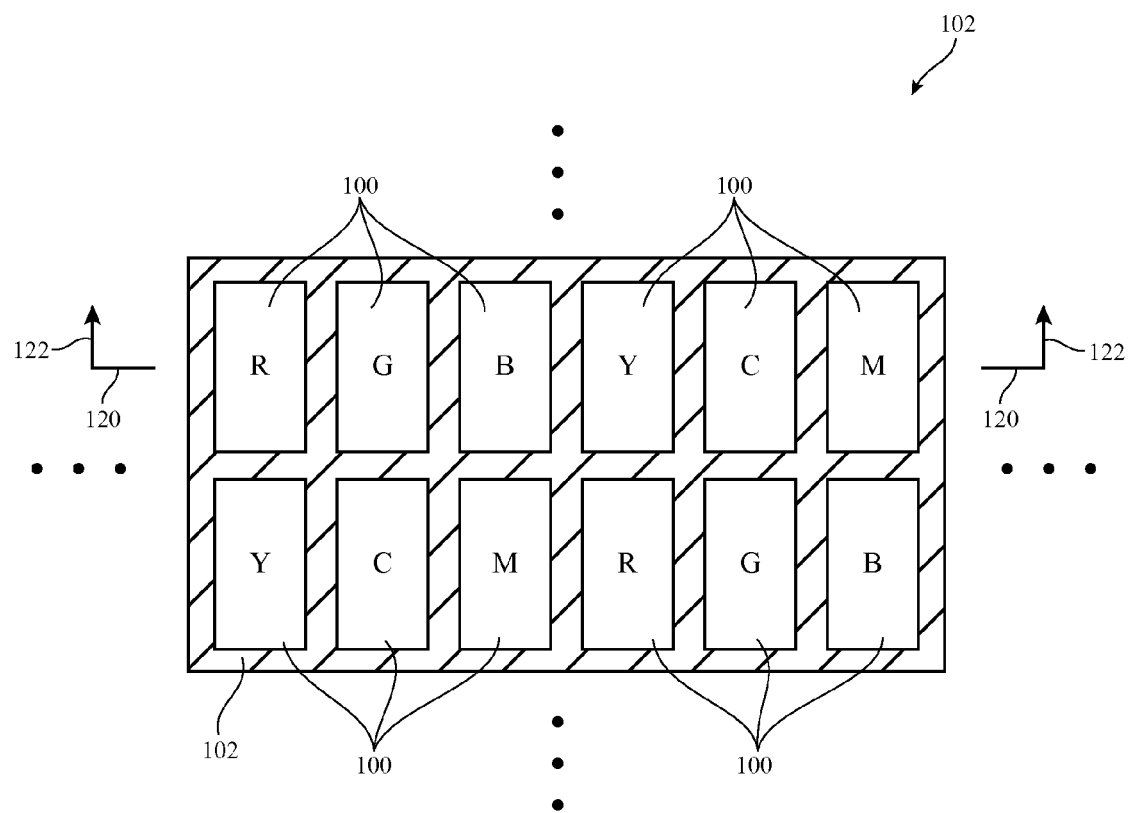
FIG. 11 is a top view of a portion of a color filter layer showing how the color filter layer may have color filter elements of six different colors where each set of six colors is arranged in a row and where different sets of color filter elements are arranged in different patterns in accordance with an embodiment.

FIG. 11 is a top view of a portion of a color filter 104 in which two different 1×6 blocks of color filter elements are used in forming a color filter array. Color filter elements 100 of FIG. 6 may include a red color filter element (R), a green color filter element (G), a blue color filter element (B), a yellow color filter element (Y), a cyan color filter element (C), and a magenta color filter element (M). Black matrix 102 may be formed from black photoimageable polymer (i.e., black masking material) or may be formed form overlapping color filter element layers (e.g., overlapping colors that block light and therefore serve as black matrix structures).

The upper and lower 1×6 sets of color filter elements 100 that are shown in FIG. 6 may cover the entire surface of display 14 in a tiled fashion. In the example of FIG. 6, the upper row of color filter elements 100 is arranged in a R, G, B, Y, C, and M pattern and the lower row of color filter elements 100 is arranged in a Y, C, M, R, G, B pattern. The use of different patterns for adjacent rows of color filter elements may help enhance display resolution by spatially separating pixels of identical colors.

Figure 12:
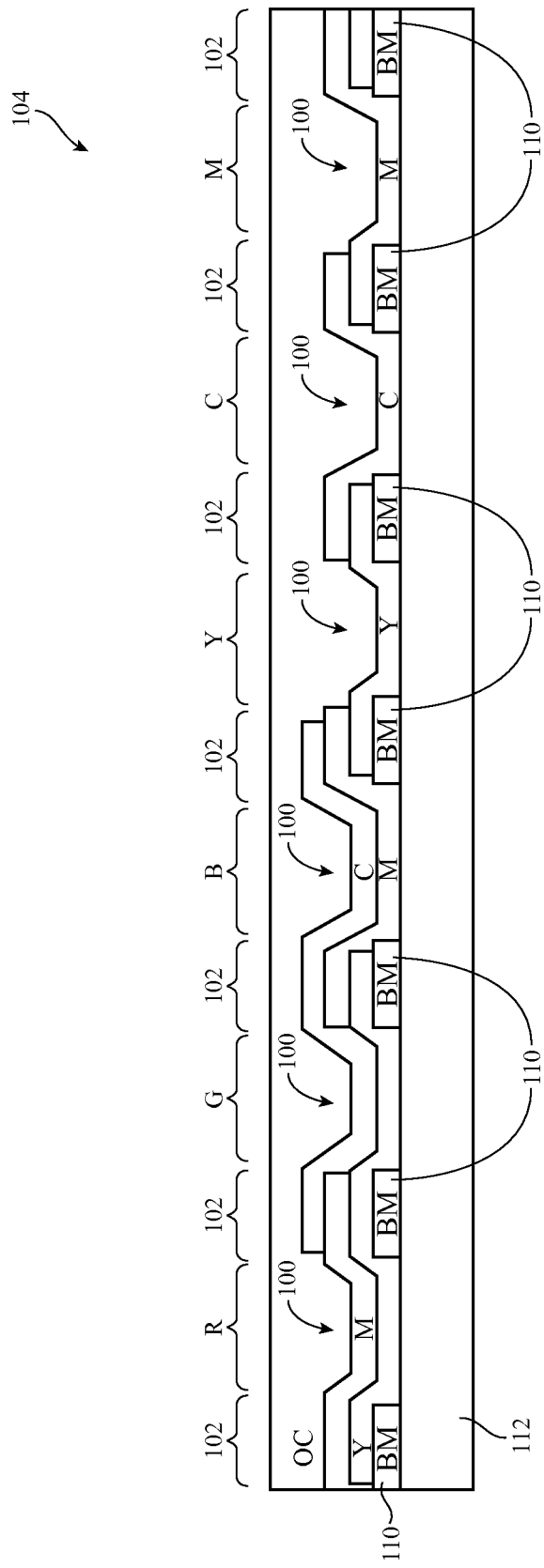
FIG. 12 is a cross-sectional side view of the color filter layer of FIG. 11 taken through the upper set of six different color filter elements in accordance with an embodiment.

A cross-sectional side view of color filter elements 100 of FIG. 1 taken along line 120 and viewed in direction 122 is shown in FIG. 12. As shown in FIG. 12, black matrix 102 may be formed by depositing and patterning black masking material 110 onto substrate 112. If desired, overlapping color filter element material (e.g., overlapping yellow, cyan, and magenta polymer layers) may be used to form black matrix 102. The configuration of FIG. 12 is merely illustrative.

Red color filter element R is formed by overlapping magenta polymer M and yellow polymer Y. Green color filter element G is formed by overlapping cyan polymer C with yellow polymer Y. Blue color filter element B is formed by overlapping cyan polymer C with magenta polymer M. Yellow color filter element Y is formed form a single layer of yellow polymer Y. Cyan color filter element C is formed from a single layer of cyan polymer C. Magenta color filter element M is formed from a single layer of magenta polymer. A clear planarization layer (overcoat layer OC) may cover color filter elements 100.

Figure 13:
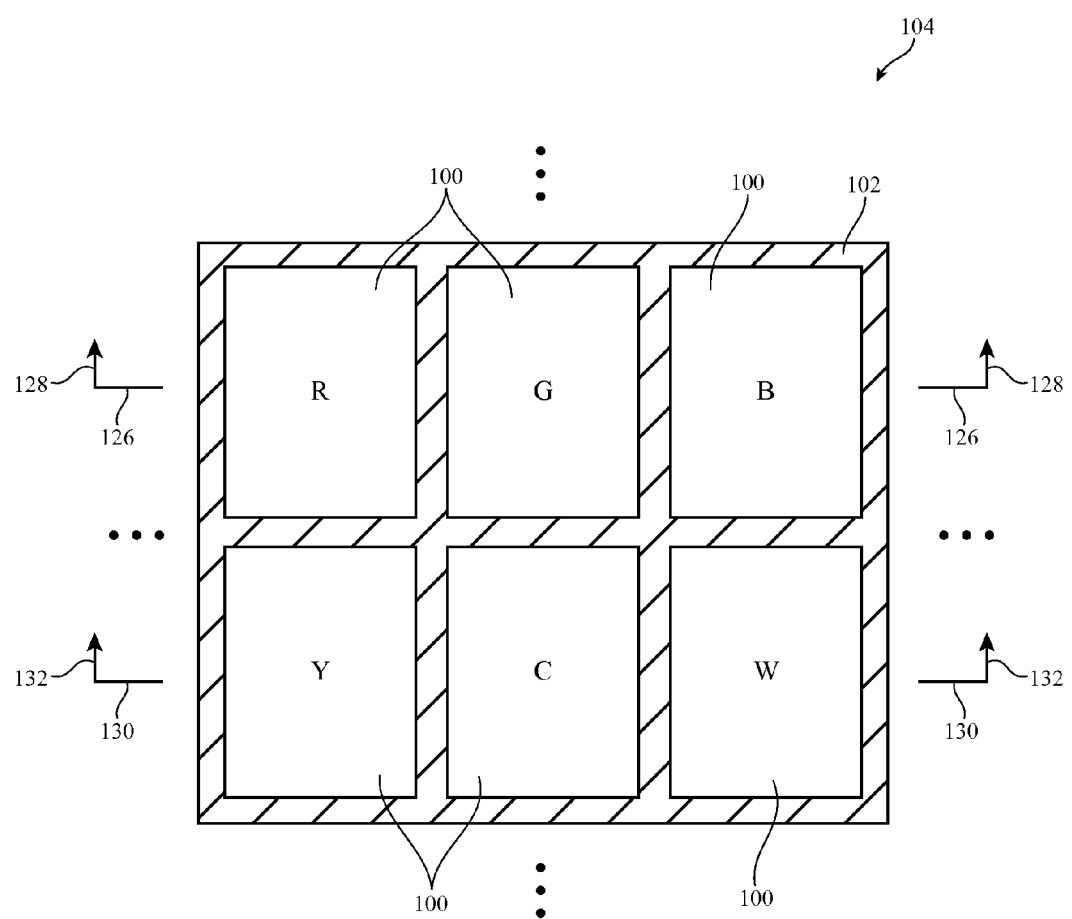
FIG. 13 is a top view of a portion of a color filter layer showing how the color filter layer may have color filter elements of six different colors including white (clear) elements where each set of six colored elements is grouped in two rows of three elements each in accordance with an embodiment.

If desired, white color filter elements 100 may be incorporated into color filter 104. White color filter elements 100 are clear and do not impart any color to backlight 44. White color filter elements can be formed by omitting colored polymer from openings in black matrix 102. Consider, as an example, the illustrative color filter pattern of FIG. 13. In the example of FIG. 13, color filter 104 has color filter elements 100 that are arranged in a repeating 2×3 array that includes an upper row of red R, green G, and blue B color filter elements 100 and that includes a lower row of yellow Y, cyan C, and white W color filter elements 100.

Figure 14:
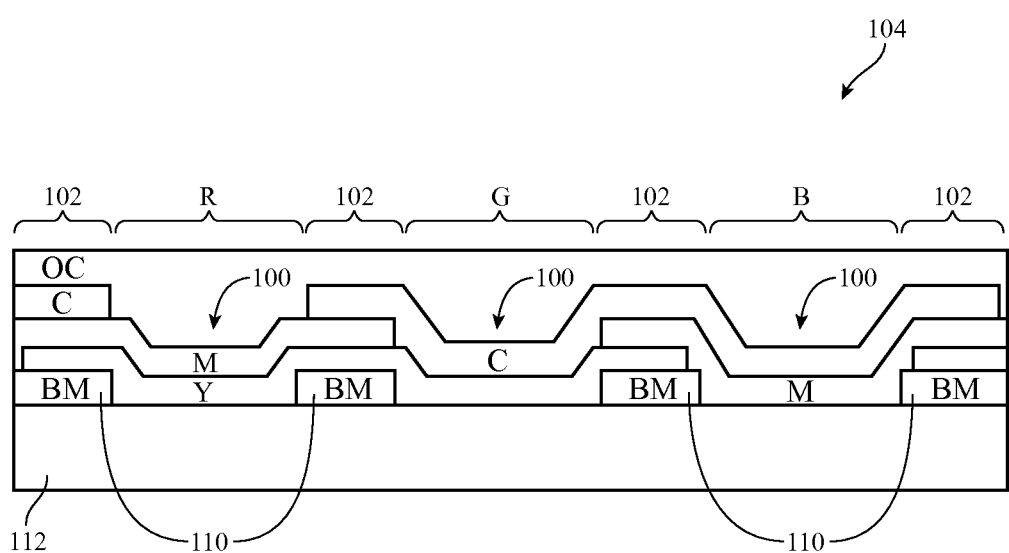
FIG. 14 is a cross-sectional side view of the color filter layer of FIG. 13 taken through the upper row of color filter elements in a configuration in which the color filter layer has a black matrix formed from black masking material in accordance with an embodiment.

A cross-sectional side view of color filter elements 100 of FIG. 13 taken along line 126 and viewed in direction 128 is shown in FIG. 14. As shown in FIG. 14, black matrix 102 may be formed by depositing and patterning black masking material 110 onto substrate 112. If desired, overlapping color filter element material (e.g., overlapping yellow, cyan, and magenta polymer layers) may be used to form black matrix 102. The configuration of FIG. 14 is merely illustrative. As shown in FIG. 14, red color filter element R is formed by overlapping magenta polymer M and yellow polymer Y. Green color filter element G is formed by overlapping cyan polymer C with yellow polymer Y. Blue color filter element B is formed by overlapping cyan polymer C with magenta polymer M.

Figure 15:
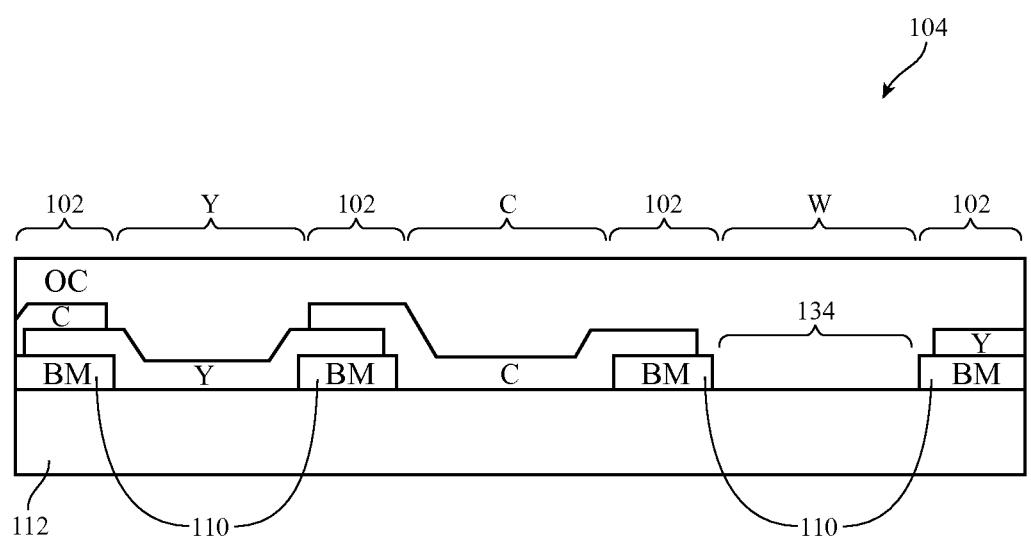
FIG. 15 is a cross-sectional side view of the color filter layer of FIG. 13 taken through the lower row of color filter elements in a configuration in which the color filter layer has a black matrix formed from black masking material in accordance with an embodiment.

A cross-sectional side view of color filter elements 100 of FIG. 13 taken along line 126 and viewed in direction 128 is shown in FIG. 15. As shown in FIG. 15, yellow color filter element Y is formed from a single layer of yellow polymer Y. Cyan color filter element C is formed from a single layer of cyan polymer C. White color filter element W is formed by omitting colored polymer from opening 134 in black matrix 102 (i.e., opening 134 for white color filter element W contains only clear overcoat OC and does not contain any non-clear polymer).

In the example of FIG. 13, a 2×3 filter element pattern was used in forming color filter 104. If desired, a 1×6 arrangement of the type described in connection with FIG. 11 may be used (e.g., an arrangement where each of the two sets of 1×6 color filter element groups in adjacent rows has a different pattern).

Figure 16:
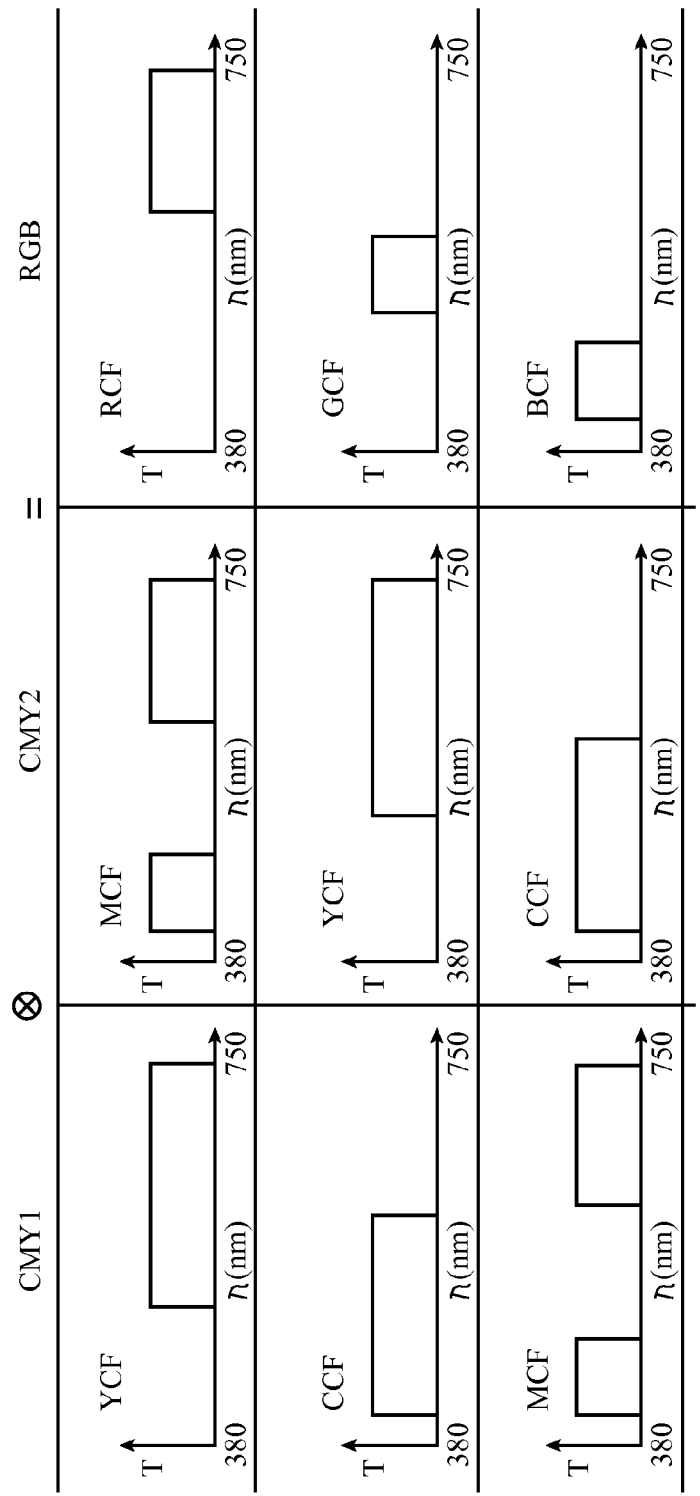
FIG. 16 are graphs in which transmission has been plotted as a function of wavelength for polymers of different colors and showing how different colored polymers may be combined to form color filters of desired colors in accordance with an embodiment.

FIG. 16 contains graphs in which transmission has been plotted as a function of wavelength λ for polymers of different colors such as yellow polymer (YCF), cyan polymer (CCF), and magenta polymer (MCF). The first column of FIG. 16 shows the transmission spectrum for a yellow layer, a cyan layer, and a magenta layer. The second column shows the transmission spectrum for three layers (magenta, yellow, and cyan, respectively) that may be combined with the first layers. The third column of FIG. 16 shows the resulting color filter elements that are produced when the colored layers of the first and second columns overlap. The first row of FIG. 16 shows how a red color filter RCF can be produced by overlapping yellow and magenta polymer layers. The second row of FIG. 16 shows how a green color filter element GCF can be produced by overlapping cyan and yellow polymer layers. The third row of FIG. 16 shows how blue color filter element BCF can be produced by overlapping magenta and cyan polymer layers.

The foregoing is merely illustrative and various modifications can be made by those skilled in the art without departing from the scope and spirit of the described embodiments. The foregoing embodiments may be implemented individually or in any combination.

What is claimed is:
1. A display having an array of pixels, comprising:
a color filter layer having a clear substrate and an array of color filter elements for the pixels, wherein the color filter elements are formed from colored polymer layers of different colors on the clear substrate and wherein at least some of the color filter elements are formed by overlapping two of the colored polymer layers of different colors, the color filter layer further comprising a black matrix formed from black masking material on the clear substrate, wherein the black matrix has openings in which the color filter elements are formed, wherein the two overlapping colored polymer layers of different colors overlap the black masking material, and wherein at least a portion of the black matrix is formed from the black masking material and overlapping portions of three of the colored polymer layers each of which has a different respective color; and a thin-film transistor layer that controls emitted light for the array of pixels.

2. The display defined in claim 1 wherein the thin-film transistor layer comprises an array of organic light-emitting diodes.

3. The display defined in claim 2 wherein the array of organic light-emitting diodes comprises white light diodes.

4. The display defined in claim 1 further comprising:
a layer of liquid crystal material between the color filter layer and the thin-film transistor layer.

5. The display defined in claim 1 wherein some of the openings in the black matrix are associated with white color filter elements and contain no non-clear polymer.

6. The display defined in claim 1 wherein the three colored polymers layers are a cyan polymer layer, a yellow polymer layer, and a magenta polymer layer.

7. The display defined in claim 4 wherein at least some of the color filter elements are formed from single layers of the colored polymer layers of different colors.

8. The display defined in claim 7 wherein the colored polymer layers are a cyan polymer layer, a yellow polymer layer, and a magenta polymer layer and wherein the colored filter elements that are formed from the single layers of the colored polymer layers are cyan color filter elements, yellow color filter elements, and magenta color filter elements.

9. The display defined in claim 8 wherein the color filter elements that are formed by overlapping two of the colored polymer layers of different colors include red color filter elements that are formed by overlapping the magenta and yellow polymer layers.

10. The display defined in claim 9 wherein the color filter elements that are formed by overlapping two of the colored polymer layers of different colors include green color filter elements that are formed by overlapping the cyan and yellow polymer layers.

11. The display defined in claim 10 wherein the color filter elements that are formed by overlapping two of the colored polymer layers of different colors include blue color filter elements that are formed by overlapping the cyan and magenta polymer layers.

12. The display defined in claim 11 wherein at least the portion of the black matrix is formed from the black masking material and overlapping portions of the cyan, magenta, and yellow polymer layers.

13. The display defined in claim 12 wherein the color filter elements are arranged in a repeating pattern of blocks each containing a 2×3 array of color filter elements made up of six of the red, green, blue, cyan, yellow, and magenta color filter elements.

14. The display defined in claim 12 wherein the color filter elements are arranged in blocks each containing a 1×6 array of color filter elements made up of six of the red, green, blue, cyan, yellow, and magenta color filter elements.

15. A color filter layer for a display, comprising:
a transparent substrate and an array of color filter elements of six different colors on the transparent substrate, wherein at least some of the six color filter elements are formed by overlapping colored polymer layers of different colors, wherein the colored polymer layers include a cyan polymer layer and a yellow polymer layer, wherein the six color filter elements include a blue color filter element and a green color filter element that share a common portion of the cyan polymer layer, wherein the six color filter elements include a red color filter element, and wherein the green color filter element and the red color filter element share a common portion of the yellow polymer layer.

16. The color filter layer defined in claim 15 wherein the six color filter elements include yellow color filter elements each formed from a single layer of the yellow polymer layer, magenta color filter elements each formed from a single layer of a magenta polymer layer, and cyan color filter elements each formed from a single layer of the cyan polymer layer, wherein the blue color filter element is formed by overlapping the cyan and magenta polymer layers, wherein the green color filter element is formed by overlapping the cyan and yellow polymer layers, and wherein the red color filter element is formed by overlapping the yellow and magenta polymer layers.

17. The color filter layer defined in claim 15 wherein the six color filter elements include a white color filter element.

18. The color filter layer defined in claim 17 wherein the six color filter elements include yellow color filter elements each formed from a single layer of the yellow polymer layer and cyan color filter elements each of which is formed from a single layer of the cyan polymer layer, wherein the white color filter element contains no non-clear polymer, wherein the blue color filter element is formed by overlapping the cyan and magenta polymer layers, wherein the green color filter element is formed by overlapping the cyan and yellow polymer layers, and wherein the red color filter element is formed by overlapping the yellow and magenta polymer layers.

* * * * *